(12) United States Patent
Takahashi et al.

(10) Patent No.: US 7,663,726 B2
(45) Date of Patent: Feb. 16, 2010

(54) LIQUID CRYSTAL APPARATUS AND ELECTRONIC APPARATUS

(75) Inventors: Yoji Takahashi, Matsumoto (JP); Kanechika Kiyose, Matsumoto (JP)

(73) Assignee: Epson Imaging Devices Corporation, Azumino-shi (JP)

( * ) Notice: Subject to any disclaimer, the term of this patent is extended or adjusted under 35 U.S.C. 154(b) by 223 days.

(21) Appl. No.: 11/976,294

(22) Filed: Oct. 23, 2007

(65) Prior Publication Data
US 2008/0137020 A1    Jun. 12, 2008

(30) Foreign Application Priority Data
Dec. 8, 2006   (JP) .............................. 2006-332046
Sep. 3, 2007   (JP) .............................. 2007-227828

(51) Int. Cl.
*G02F 1/1345*   (2006.01)
(52) U.S. Cl. ..................... 349/150; 349/138; 349/149
(58) Field of Classification Search .................. None
See application file for complete search history.

(56) References Cited

U.S. PATENT DOCUMENTS 5,870,160 A    2/1999   Yanagawa et al.
6,034,757 A    3/2000   Yanagawa et al.
6,108,066 A    8/2000   Yanagawa et al.
6,525,786 B1 *  2/2003   Ono ............................. 349/40

FOREIGN PATENT DOCUMENTS

| JP | A 01-283504 | 11/1989 |
| JP | A 04-051220 | 2/1992 |
| JP | A 06-160878 | 6/1994 |
| JP | A-09-105918 | 4/1997 |
| JP | A-11-337979 | 12/1999 |
| JP | A-2001-337316 | 12/2001 |
| JP | A-2006-330230 | 12/2006 |

* cited by examiner

*Primary Examiner*—Richard H Kim
(74) *Attorney, Agent, or Firm*—Oliff & Berridge, PLC

(57) ABSTRACT

A liquid crystal apparatus includes a liquid crystal display panel including two substrates with liquid crystal interposed therebetween, a conductive layer provided on an outer surface of at least one of the substrates, a flexible board electrically connected to the liquid crystal display panel, and a tape-like conductive member providing an electrical connection between the conductive layer and a grounding wire of the flexible board.

6 Claims, 10 Drawing Sheets

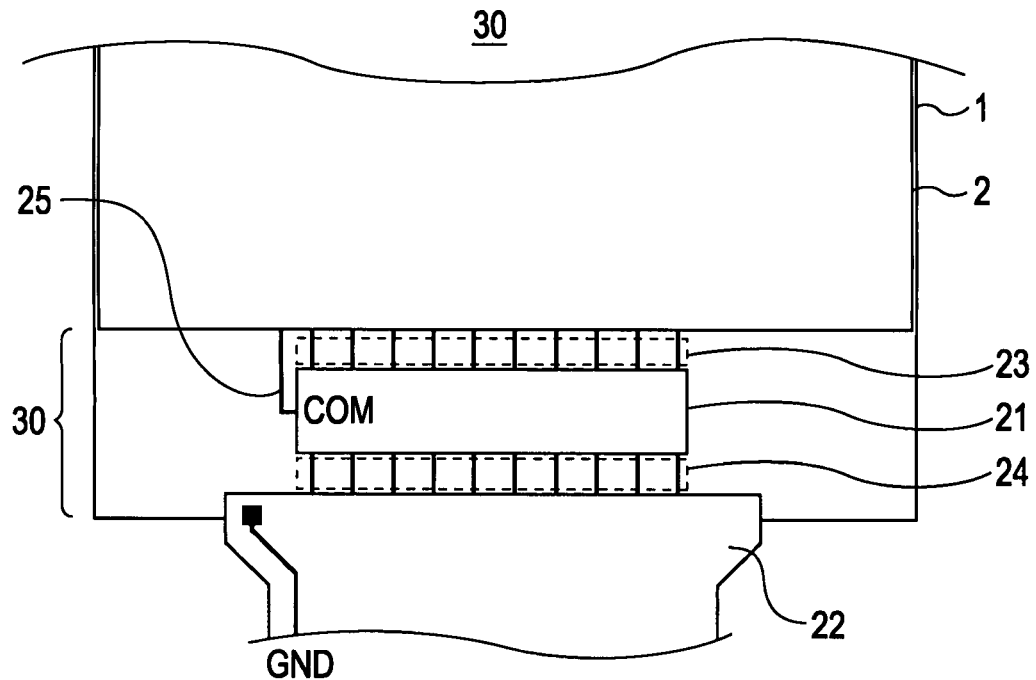
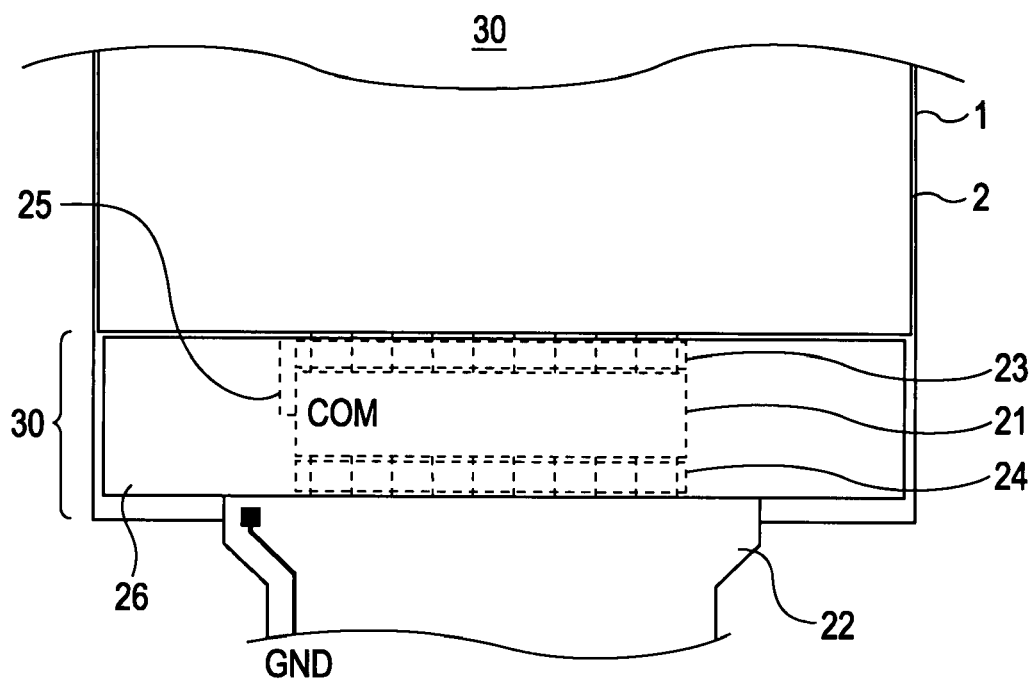

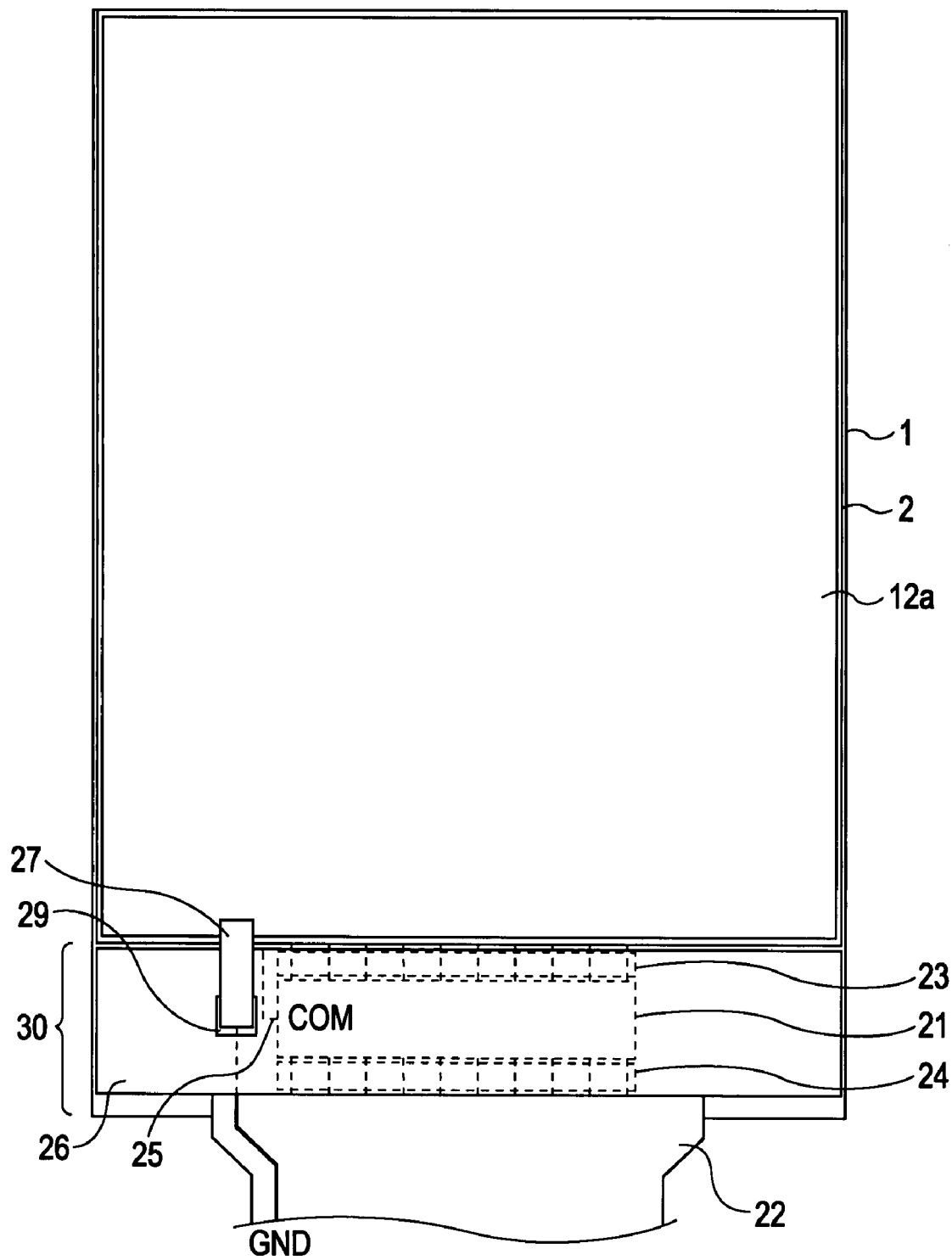

LIQUID CRYSTAL APPARATUS AND ELECTRONIC APPARATUS

The entire disclosure of Japanese Patent Application Nos. 2006-332046, filed Dec. 8, 2006 and 2007-227828, filed Sep. 3, 2007 are expressly incorporated by reference herein.

BACKGROUND

1. Technical Field

The present invention relates to a liquid crystal apparatus that is suitable for displaying various kinds of information.

2. Related Art

In recent years, liquid crystal apparatuses of a so-called horizontal-electric-field type have been attracting attention. Such apparatuses, in which an electric field applied to liquid crystal extends substantially parallel to substrates, have improved visual characteristics superior to those of the twisted-nematic (TN) type or the like. The horizontal-electric-field type liquid crystal apparatuses are further classified into apparatuses of the in-plane-switching (IPS) type, apparatuses of the fringe-field-switching (FFS) type, and the like. A horizontal-electric-field type liquid crystal apparatus includes a pair of substrates having liquid crystal interposed therebetween. Further, comb-shaped pixel electrodes and a common electrode between which a horizontal electric field is generated are provided on one of the substrates.

In such a horizontal-electric-field type liquid crystal apparatus, however, if the substrate not having the electrodes is unintentionally charged with external static electricity or the like, another electric field is also generated between the substrate having the electrodes and the substrate not having the electrodes. Consequently, proper display may not be performed.

JP-A-4-51220 discloses a liquid crystal apparatus in which substrates constituting a liquid crystal panel are provided with conductive films on the respective outer surfaces thereof so that the conductive films are connected to each other in order to prevent occurrence of local electrification and discharge.

In the liquid crystal apparatus of JP-A-4-51220, however, the charged electricity does not pass through the apparatus to the outside. Therefore, the generation of an electric field between the substrate having the electrodes and the substrate not having the electrodes in the horizontal-electric-field type liquid crystal apparatus cannot be prevented.

SUMMARY

An advantage of some aspects of the invention is that a liquid crystal apparatus having a shield function for causing electric charge to pass through the liquid crystal apparatus to the outside is provided.

According to a first aspect of the invention, a liquid crystal apparatus includes a liquid crystal display panel including two substrates with liquid crystal interposed therebetween, a conductive layer provided on an outer surface of at least one of the substrates, a flexible board electrically connected to the liquid crystal display panel, and a tape-like conductive member providing an electrical connection between the conductive layer and a grounding wire of the flexible board.

As described above, the liquid crystal apparatus includes a liquid crystal display panel, a conductive layer, a flexible board, and a tape-like conductive member. The liquid crystal display panel includes two substrates with liquid crystal interposed therebetween. The conductive layer is provided on the outer surface of at least one of the substrates. The flexible board is electrically connected to the liquid crystal display panel. The tape-like conductive member provides an electrical connection between the conductive layer and a grounding wire of the flexible board. With such a configuration, the liquid crystal apparatus can function as a shield against external static electricity or the like, and generation of an electric field between the substrates can be prevented.

In the liquid crystal apparatus according to the first aspect of the invention, one of the two substrates preferably has an extended portion extending beyond the other substrate, the extended portion having a surface provided thereon with a driver circuit and the flexible board. Further, the tape-like conductive member is preferably disposed across a region having the driver circuit. Furthermore, at least a region where the driver circuit and the tape-like conductive member overlap each other is preferably covered with an insulator. With such a configuration, occurrence of short circuits between the driver circuit and the tape-like conductive member can be prevented.

In the liquid crystal apparatus according to the first aspect of the invention, the extended portion is preferably provided with a grounding wire electrically connected to the grounding wire of the flexible board. Further, the tape-like conductive member preferably provides an electrical connection between the conductive layer and the grounding wire of the extended portion.

In the liquid crystal apparatus according to the first aspect of the invention, the conductive layer preferably includes a conductive optical sheet, such as a polarizing plate, for example.

In the liquid crystal apparatus according to the first aspect of the invention, the conductive layer preferably includes a transparent conductive film provided on the outer surface of the at least one of the substrates.

In the liquid crystal apparatus according to the first aspect of the invention, the liquid crystal display panel preferably includes a common electrode and pixel electrodes provided on one of the two substrates. Further, the conductive layer is preferably provided on an outer surface of the other substrate not having the common electrode and the pixel electrodes.

According to a second aspect of the invention, an electronic apparatus includes the liquid crystal apparatus according to the first aspect of the invention as a display unit.

According to a third aspect of the invention, a method for manufacturing a liquid crystal apparatus includes fabricating a display panel in which a driver circuit and a flexible board are provided on one of two substrates in an extended portion thereof that extends beyond the other substrate, covering at least a part of the driver circuit on the extended portion with an insulator, attaching a conductive layer on an outer surface of the other substrate, and pasting one end and the other end of a tape-like conductive member to the conductive layer and a grounding wire of the flexible substrate, respectively, so as to provide an electrical connection therebetween. With this method for manufacturing a liquid crystal apparatus, occurrence of short circuits between the driver circuit and the tape-like conductive member can be prevented.

BRIEF DESCRIPTION OF THE DRAWINGS

The invention will be described with reference to the accompanying drawings, wherein like numbers reference like elements.

FIG. 6A is a schematic diagram showing a process for manufacturing the liquid crystal apparatus according to the embodiment.

FIG. 6B is a schematic diagram showing another process for manufacturing the liquid crystal apparatus according to the embodiment.

FIG. 8 is a plan view of the liquid crystal apparatus according to a first modification.

DESCRIPTION OF EXEMPLARY EMBODIMENTS

An embodiment of the invention will now be described with reference to the accompanying drawings. Herein, a liquid crystal apparatus according to the following embodiment of the invention incorporates an illumination device.

Configuration of Liquid Crystal Apparatus

Figure 1:
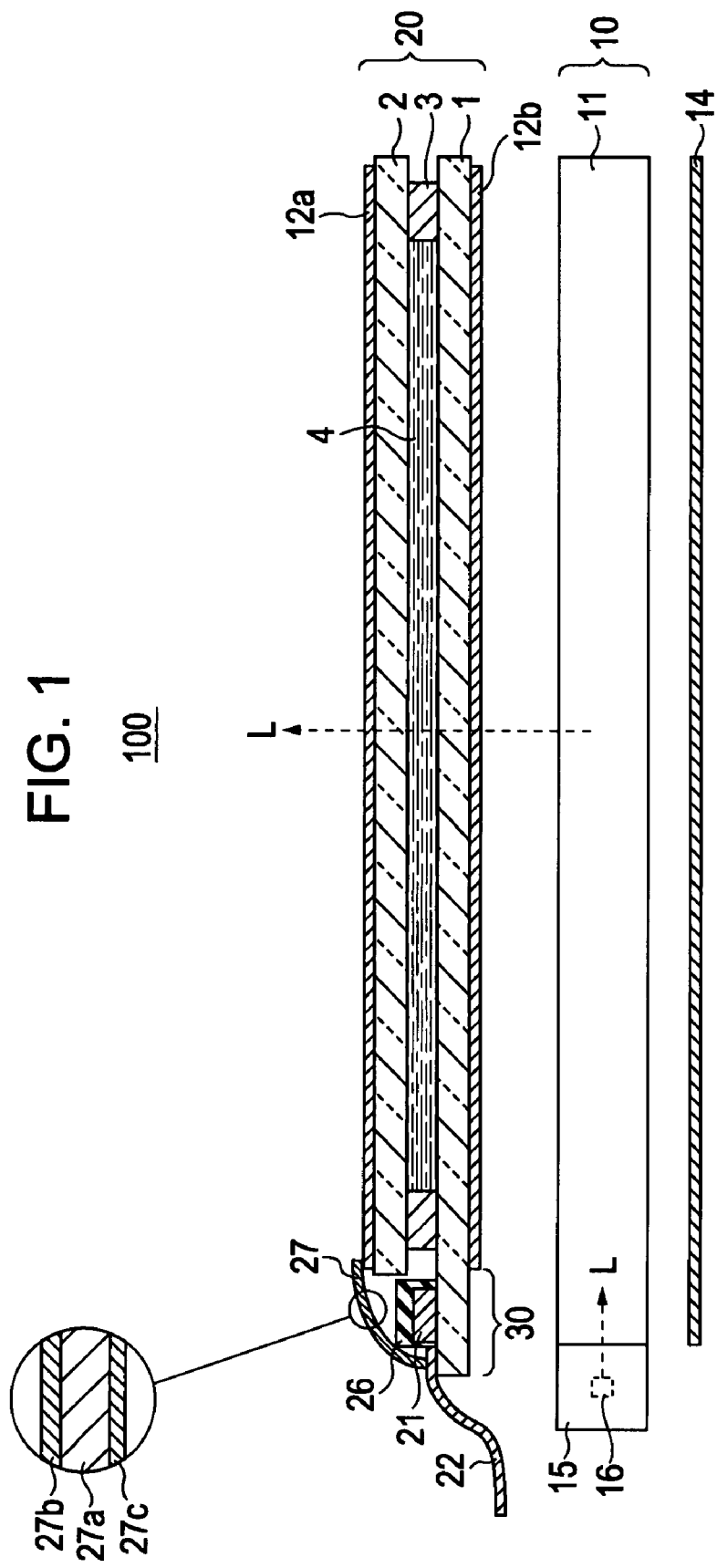
FIG. 1 is a cross-sectional view of a liquid crystal apparatus according to an embodiment.
Figure 2:
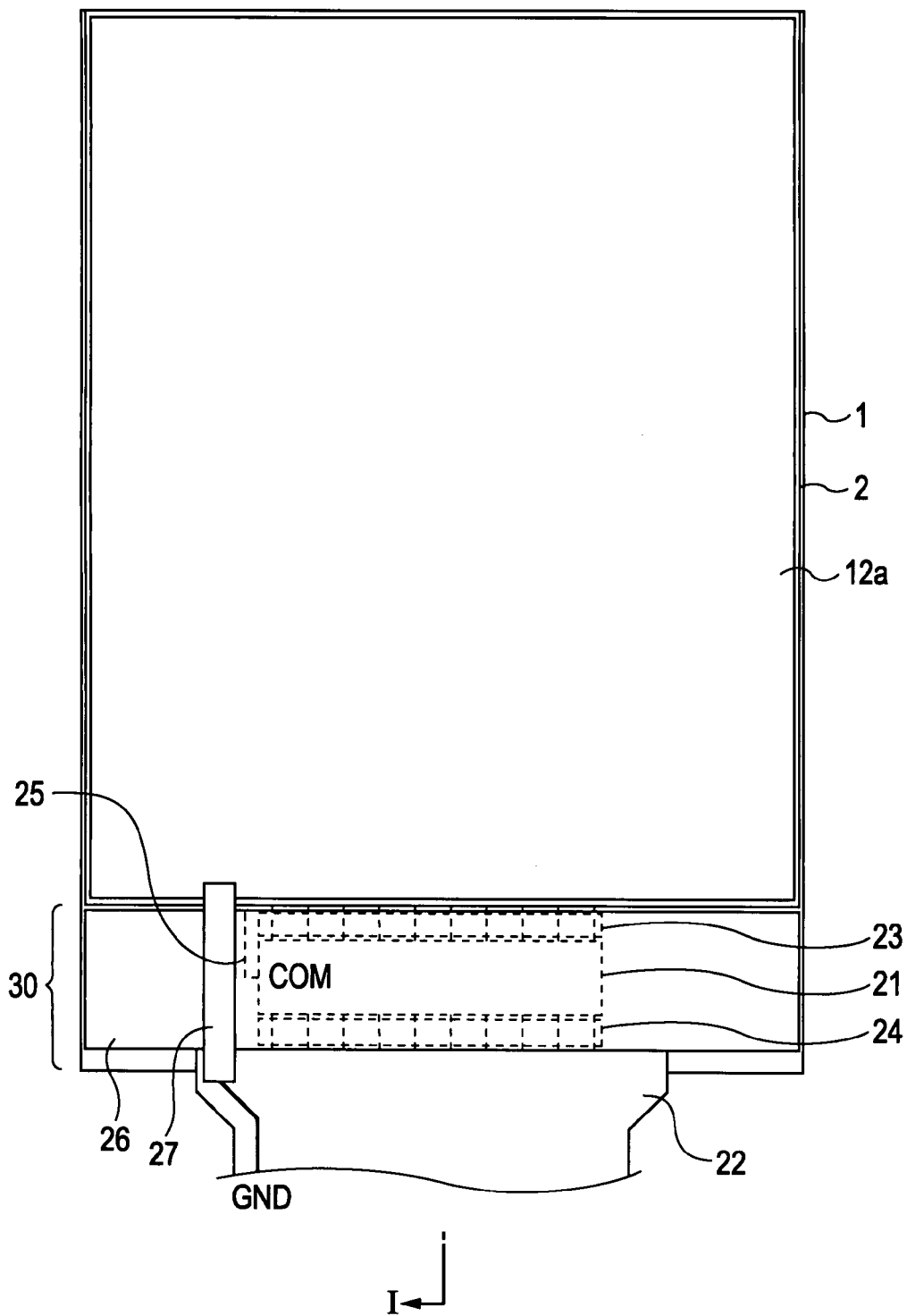
FIG. 2 is a plan view of the liquid crystal apparatus according to the embodiment.

FIG. 1 is a cross-sectional view of a liquid crystal apparatus 100 according to the embodiment. FIG. 2 is a plan view of the liquid crystal apparatus 100 according to the embodiment. FIG. 1 shows a cross-section of the liquid crystal apparatus 100 in FIG. 2, taken along line I-I.

The liquid crystal apparatus 100 mainly includes an illumination device 10 and a liquid crystal display panel 20. The illumination device 10 mainly includes a light-guiding plate 11 and a light source unit 15. The liquid crystal display panel 20 is disposed above the top surface of the light-guiding plate 11. The illumination device 10 also includes a reflection sheet 14 below the bottom surface of the light-guiding plate 11.

The light source unit 15 is disposed at one end of the light-guiding plate 11 and includes a plurality of light-emitting diodes (LEDs) 16 as point light sources. Light L emitted from the LEDs 16 enters the light-guiding plate 11 through the end face thereof. The light L has its traveling direction changed by being reflected repeatedly between the top and bottom surfaces of the light-guiding plate 11 and is emitted toward the liquid crystal display panel 20.

The liquid crystal display panel 20 has a display area of substantially the same size as the light-emitting area of the light-guiding plate 11. The liquid crystal display panel 20 is constituted by substrates 1 and 2, made of glass or the like, bonded together with a sealant 3 interposed therebetween so as to provide a cell structure, into which liquid crystal 4 is injected. As shown in FIGS. 1 and 2, the substrate 1 has an extended portion 30 that extends beyond the substrate 2.

The substrate 1 is provided with a polarizing plate 12b on the outer surface thereof. The substrate 2 is provided with a polarizing plate 12a on the outer surface thereof. The polarizing plate 12a is provided with a conductive film as a transparent conductive member composed of indium tin oxide (ITO) or the like, which will be described below in detail, on the outer surface thereof. The surface of the polarizing plate 12a provided with the conductive film has an electrical connection with a grounding wire GND of a flexible printed circuit (FPC) 22 through a tape-like conductive member (hereinafter referred to as a conductive tape) 27. Accordingly, the polarizing plate 12a serves as a conductive layer in the embodiment of the invention.

As an optical sheet (not shown), a diffusing sheet and a prism sheet, for example, are provided between the illumination device 10 and the liquid crystal display panel 20. The diffusing sheet omnidirectionally diffuses the light L emitted from the light-guiding plate 11. The prism sheet condenses the light L onto the liquid crystal display panel 20.

Figure 3A:
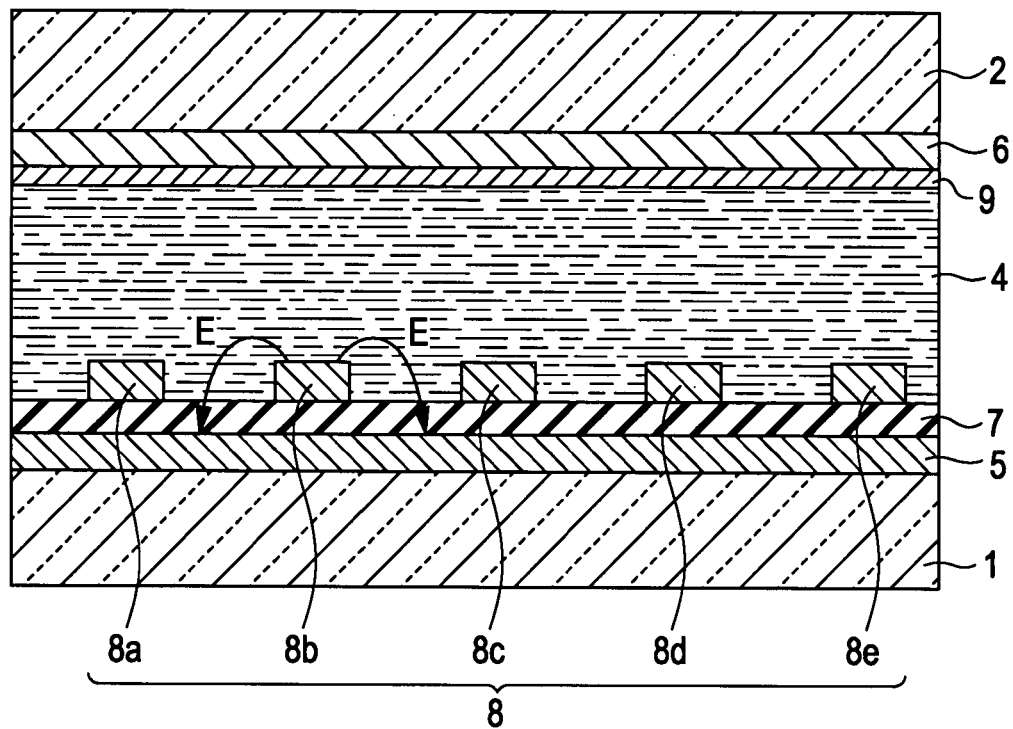
FIG. 3A is a cross-sectional view of one sub-pixel of the liquid crystal apparatus according to the embodiment.

Next, the internal configuration of the liquid crystal display panel 20 will be described. The liquid crystal display panel 20 is of the horizontal-electric-field type. FIG. 3A is an enlarged cross-sectional view showing one of sub-pixels in the liquid crystal display panel 20. The liquid crystal display panel 20 taken as an example in the embodiment is of the fringe-field-switching (FFS) type.

As described above, the liquid crystal display panel 20 includes the substrates 1 and 2 with the liquid crystal 4 injected therebetween. The substrate 1 is provided with a common electrode 5 made of a transparent conductive member, such as ITO, over the entirety of the internal surface thereof. The common electrode 5 is provided with an insulating layer 7 made of acrylic resin or the like over the entirety of the internal surface thereof. The insulating layer 7 is provided with pixel electrodes 8 made of a transparent conductive material, such as ITO, on the internal surface thereof. The substrate 2 is provided with a coloring layer 6 on the internal surface thereof. The coloring layer 6 is provided with an alignment film 9 on the internal surface thereof.

Figure 3B:
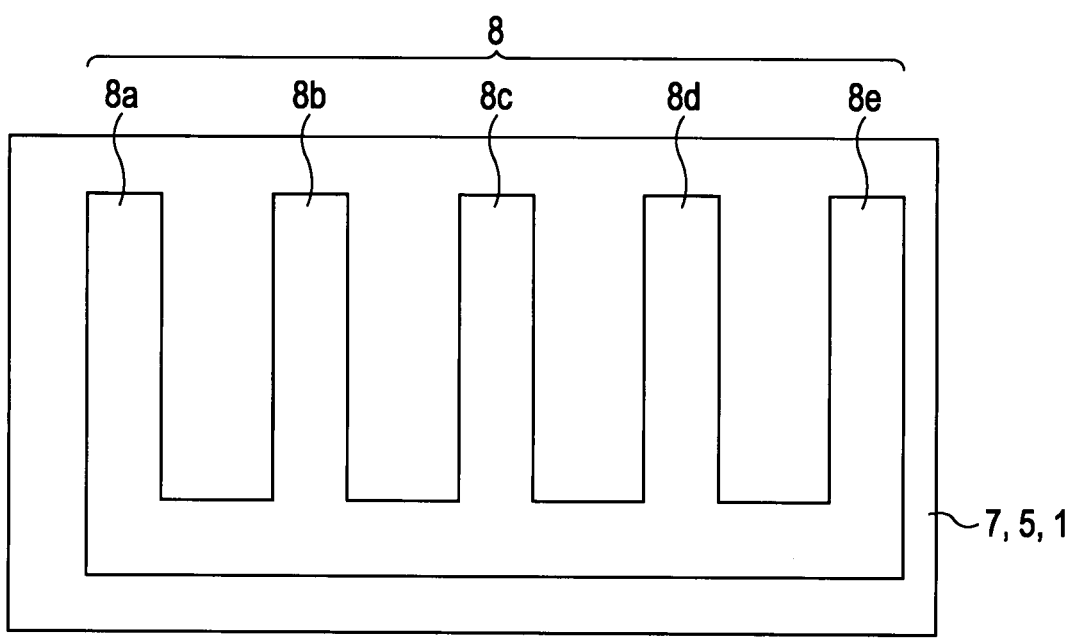
FIG. 3B is a plan view of one sub-pixel of the liquid crystal apparatus according to the embodiment.

Referring to FIG. 3B, which is a plan view of one of the pixel electrodes 8, the pixel electrode 8 has a comb shape. Specifically, the pixel electrode 8 includes a plurality of linear conductive portions 8a to 8e that are aligned in parallel and formed as an integral part. In the liquid crystal display panel 20, a horizontal electric field E is generated between the common electrode 5 and the conductive portions 8a to 8e of the pixel electrode 8.

Referring again to FIGS. 1 and 2, the extended portion 30 of the substrate 1 has a driver integrated circuit (IC) 21, as an IC, i.e., a driver, for driving liquid crystal, provided directly on the surface thereof by using the chip-on-glass (COG) technique. The liquid crystal display panel 20 has the FPC 22, a flexible board, at one end thereof. The extended portion 30 of the substrate 1 has, on the surface thereof, wiring patterns 23 to 25 made of copper foil, for example, patterned by photoetching or the like. Some terminals of the driver IC 21 are electrically connected to the FPC 22 through the wiring pattern 24 provided on the extended portion 30 of the substrate 1. A driver circuit section including the driver IC 21 and the wiring patterns 23 to 25 is covered with an insulator 26. In FIG. 2, the driver circuit section including the driver IC 21 and the wiring patterns 23 to 25 is illustrated using dotted lines in order to clarify the positional relationship with the insulator 26. Hereinafter, the term "driver circuit" is used as a term including all electrical elements, such as the driver IC 21 and the wiring patterns 23 to 25, provided on the extended portion 30 of the substrate 1.

The pixel electrodes 8 are electrically connected to some terminals of the driver IC 21 through the wiring pattern 23 provided on the extended portion 30 of the substrate 1. The common electrode 5 is electrically connected to a common-potential terminal (COM terminal) of the driver IC 21 through the wiring pattern 25 provided on the extended portion 30 of the substrate 1. The driver IC 21 controls the magnitude of the electric field E in accordance with a control signal supplied from an external electronic apparatus through the FPC 22. In the liquid crystal display panel 20 of the horizontal-electric-field type, the orientation of liquid crystal molecules in the liquid crystal 4 is changed by controlling the magnitude of the electric field E, whereby the gradation in a display screen is changed.

Accordingly, in the liquid crystal display panel 20 of the horizontal-electric-field type, electrodes such as the pixel electrodes 8 and common electrode 5 are all provided on the internal surface of the substrate 1, whereas no electrodes are provided on the internal surface of the substrate 2. In such a case, therefore, if the surface of the polarizing plate 12a provided on the outer surface of the substrate 2 is unintentionally charged with external static electricity or the like, another electric field is generated between the substrates 1 and 2 and affects liquid crystal molecules of the liquid crystal 4. Consequently, the liquid crystal display panel 20 cannot perform proper display.

Hence, in the liquid crystal apparatus 100 according to the embodiment, the polarizing plate 12a is provided with a conductive film over the entirety of the outer surface thereof, whereby an electrical connection is provided between the grounding wire GND of the FPC 22 and the surface of the polarizing plate 12a having the conductive film, with the aid of the conductive tape 27, as described above.

This causes the electricity charged on the surface of the polarizing plate 12a to pass through the polarizing plate 12a, the conductive tape 27, and the grounding wire GND to the outside. In such a manner, the liquid crystal apparatus 100 can function as a shield against external static electricity or the like, and generation of an electric field between the substrates 1 and 2 can be prevented.

As shown in FIG. 1, the conductive tape 27 specifically includes a metal layer 27a composed of copper (Cu) or the like, an insulating layer 27b provided on one surface of the metal layer 27a, and a conductive adhesive layer 27c provided on the other surface of the metal layer 27a. The insulating layer 27b completely insulates the one surface of the metal layer 27a, and prevents the metal layer 27a from rusting. One end and the other end of the conductive tape 27 are pasted to the grounding wire GND of the FPC 22 and the surface of the polarizing plate 12a having the conductive film, respectively, with the aid of the conductive adhesive layer 27c.

In FIG. 2, the conductive tape 27 is shown at a position shifted from the driver circuit including the driver IC 21 and the wiring patterns 23 to 25 for easier description. However, the conductive tape 27 may actually be disposed across the region having the driver circuit.

Figure 4A:
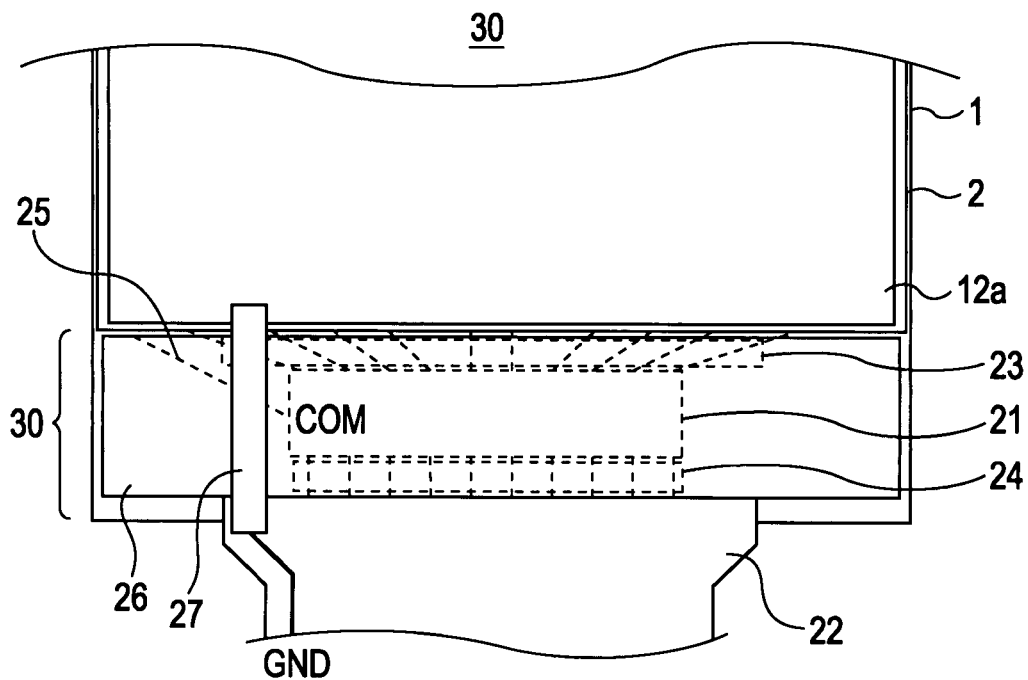
FIG. 4A illustrates a modified arrangement of a driver circuit of the liquid crystal apparatus according to the embodiment.
Figure 4B:
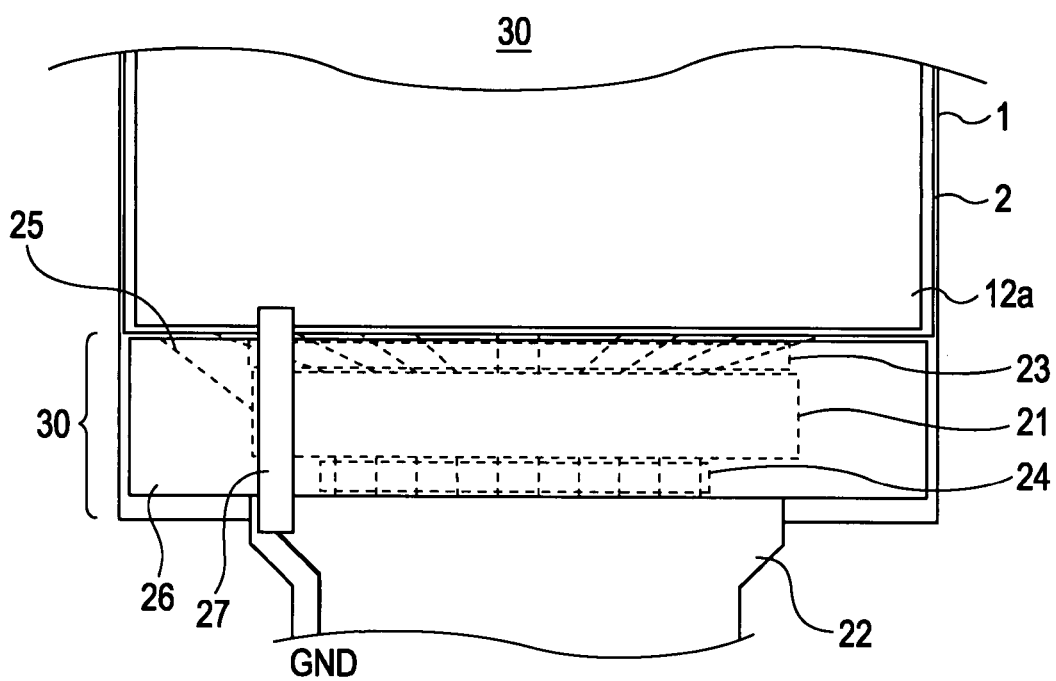
FIG. 4B illustrates another modified arrangement of the driver circuit of the liquid crystal apparatus according to the embodiment.

FIGS. 4A and 4B show modified arrangements of the driver circuit in the liquid crystal apparatus 100 shown in FIG. 2, specifically, examples in which the conductive tape 27 is disposed across the region having the driver circuit. In FIG. 4A showing a first example, members of the wiring pattern 23 extend at different angles from the driver IC 21 toward the pixel electrodes 8 provided on the internal surface of the substrate 2. In the first example, the conductive tape 27 is disposed across a part of the region having the wiring pattern 23. In FIG. 4B showing a second example, the driver IC 21 is wider than that of the liquid crystal apparatus 100 in the first example. In the second example, the conductive tape 27 is disposed across the region having the driver IC 21.

In the modified arrangements described above, since the conductive adhesive layer 27c faces the extended portion 30 of the substrate 1, a short circuit may occur if the conductive tape 27 comes into contact with the driver circuit including the wiring pattern 23 and the driver IC 21 provided on the extended portion 30 of the substrate 1.

In the liquid crystal apparatus 100 according to the embodiment, the driver circuit including the driver IC 21 and the wiring patterns 23 to 25 provided on the extended portion 30 of the substrate 1 is covered with the insulator 26. Accordingly, occurrence of short circuits between the driver circuit on the extended portion 30 of the substrate 1 and the conductive tape 27 can be prevented in the liquid crystal apparatus 100. Although FIG. 1 shows the driver circuit entirely covered with the insulator 26, the configuration is not limited thereto. The insulator 26 may also be provided only over a part of the extended portion 30 below the conductive tape 27, i.e., a region of the extended portion 30 where the driver circuit and the conductive tape 27 overlap each other, as long as the insulator 26 can prevent occurrence of short circuits between the driver circuit and the conductive tape 27 provided on the extended portion 30 of the substrate 1.

Method for Manufacturing Liquid Crystal Apparatus

Figure 5:
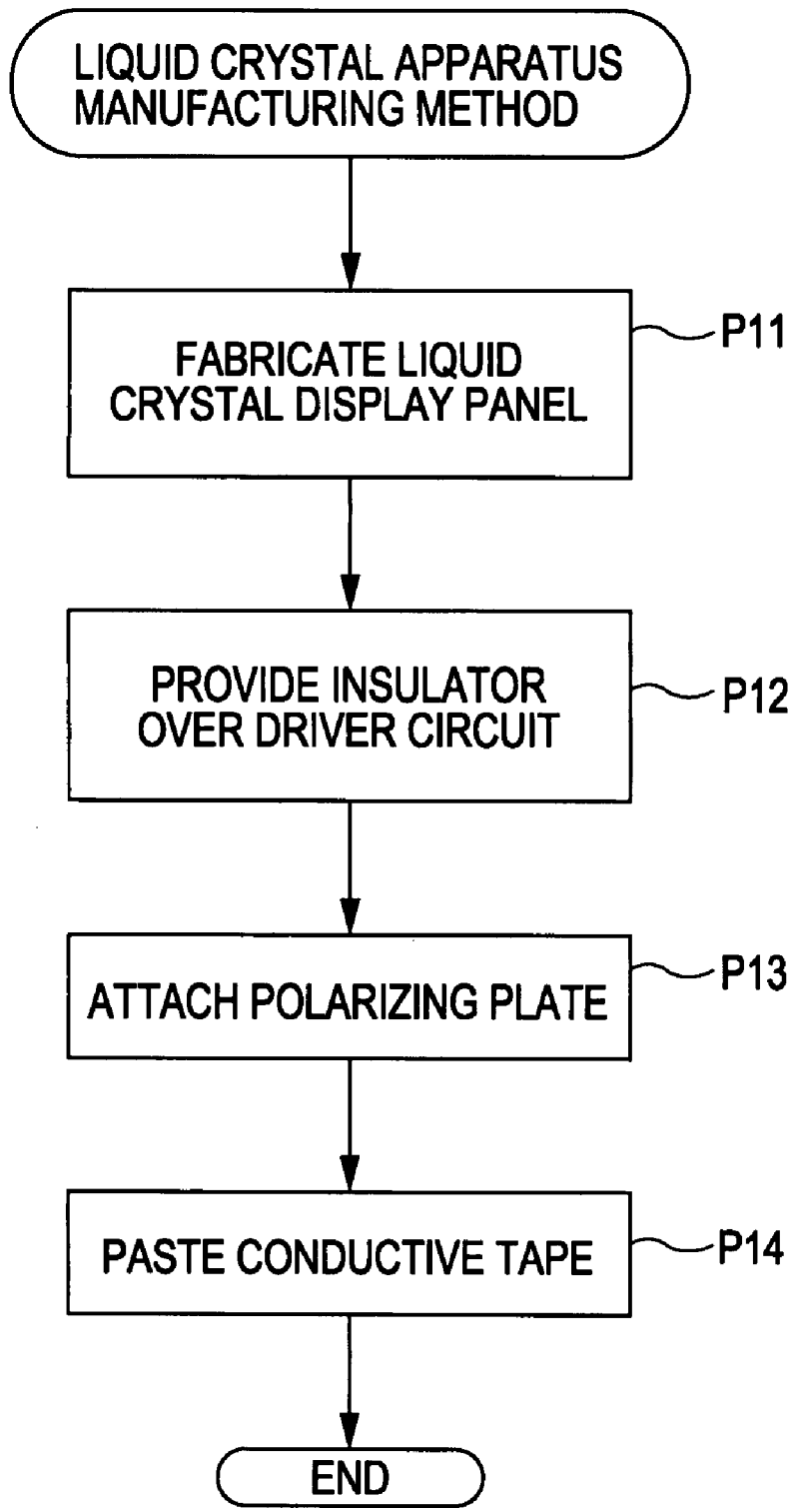
FIG. 5 is a flowchart showing a method for manufacturing the liquid crystal apparatus according to the embodiment.

Next, a method for manufacturing the liquid crystal apparatus 100 according to the embodiment will be described. FIG. 5 is a flowchart showing a method for manufacturing the liquid crystal apparatus 100 according to the embodiment. FIGS. 6A to 7B are schematic diagrams showing processes of manufacturing the liquid crystal apparatus 100 according to the embodiment, specifically, enlarged plan views of the extended portion 30.

FIG. 6A shows a process for manufacturing a display panel. In this process, the substrate 1 and the substrate 2 are bonded together, the liquid crystal 4 is injected into the space between the substrates 1 and 2, and then the driver IC 21 and the FPC 22 are provided on the substrate 1 by using the chip-on-glass (COG) technique so as to be electrically connected to the wiring patterns 23 to 25 provided on the extended portion 30 of the substrate 1 (process P11).

Figure 7A:
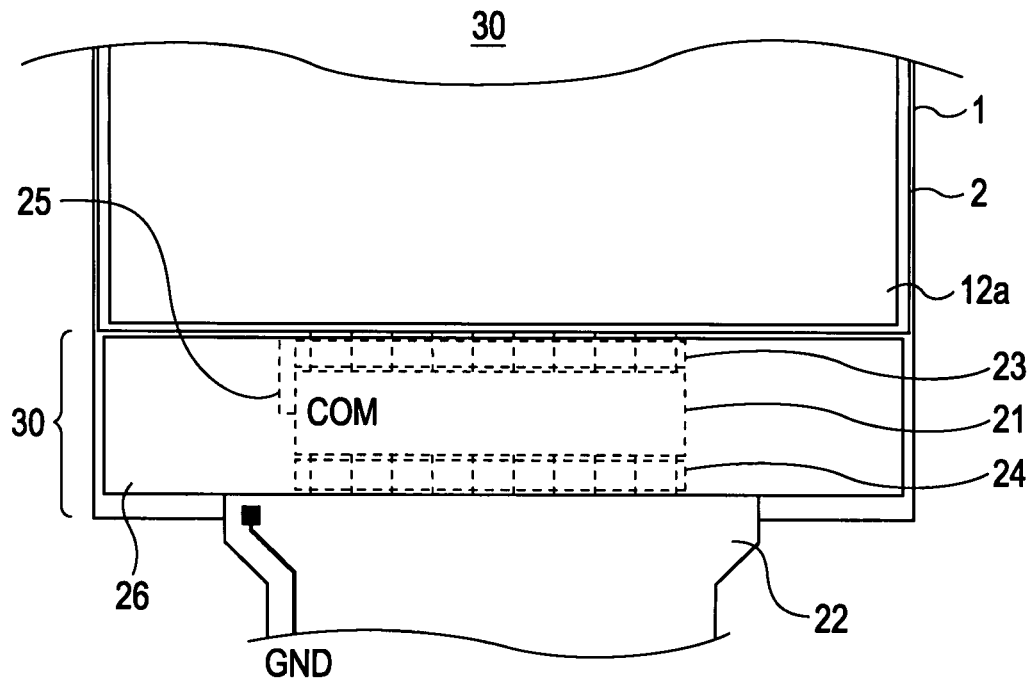
FIG. 7A is a schematic diagram showing yet another process for manufacturing the liquid crystal apparatus according to the embodiment.

Next, in a process for covering a driver circuit, a liquid-state insulating substance, for example, is applied to and cured on the extended portion 30 of the substrate 1. Thus, as shown in FIG. 6B, the driver circuit including the driver IC 21 and the wiring patterns 23 to 25 provided on the extended portion 30 of the substrate 1 is covered with the insulator 26 (process P12). In FIGS. 6A and 6B and other figures referred to below, the driver circuit including the driver IC 21 and the wiring patterns 23 to 25 are illustrated using dotted lines in order to clarify the positional relationship with the insulator 26. Referring to FIG. 7A, in a process for providing a conductive layer, the polarizing plate 12a is attached to the outer surface of the substrate 2 (process P13). Alternatively, the polarizing plate 12a may also be attached first to the substrate 2, and then the driver circuit including the driver IC 21 and the wiring patterns 23 to 25 may be covered with the insulator 26. In the latter case, however, the polarizing plate 12a may be contaminated during the application of the liquid-state insulating substance to the extended portion 30 of the substrate 1. Therefore, it is preferable to attach the polarizing plate 12a to the substrate 2 after covering the driver circuit including the driver IC 21 and the wiring patterns 23 to 25 provided on the extended portion 30 of the substrate 1 with the insulator 26.

Figure 7B:
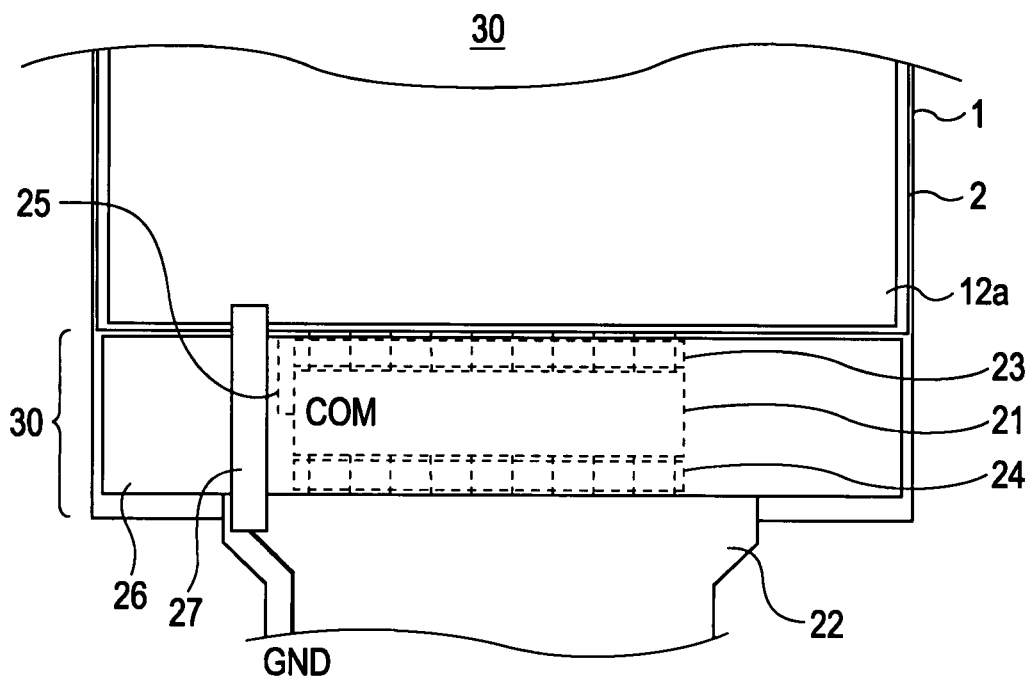
FIG. 7B is a schematic diagram showing yet another process for manufacturing the liquid crystal apparatus according to the embodiment.

Next, referring to FIG. 7B, in a process for pasting a tape-like conductive member, the grounding wire GND of the FPC 22 and the surface of the polarizing plate 12a having the conductive film are connected to each other by pasting the conductive tape 27 therebetween (process P14).

As described above, by first covering the driver circuit including the driver IC 21 and the wiring patterns 23 to 25 provided on the extended portion 30 of the substrate 1 with the insulator 26 and then providing an electrical connection between the grounding wire GND and the polarizing plate 12a through the conductive tape 27, occurrence of short circuits between the driver circuit disposed on the extended portion 30 of the substrate 1 and the conductive tape 27 can be prevented.

Modifications

Next, modifications of the liquid crystal apparatus 100 according to the embodiment will be described.

FIG. 8 is a plan view of the liquid crystal apparatus 100 according to a first modification. The liquid crystal apparatus 100 of the first modification differs from the liquid crystal apparatus 100 of the embodiment in that the extended portion 30 is provided with a grounding wire that is electrically connected to the grounding wire GND of the FPC 22 and that the polarizing plate 12a and the grounding wire of the extended portion 30 have an electrical connection through the conductive tape 27. Also in such a manner, the liquid crystal apparatus 100 can function as a shield against external static electricity or the like, and generation of an electric field between the substrates 1 and 2 can be prevented.

A method for manufacturing the liquid crystal apparatus 100 according to the first modification will be described focusing on differences from the above-described processes shown as the flowchart in FIG. 5. In process P12, after a mask is provided over a terminal 29 of the grounding wire on the extended portion 30 of the substrate 1, an insulating substance is applied over the extended portion 30. Thus, the driver circuit including the driver IC 21 and the wiring patterns 23 to 25 provided on the extended portion 30 of the substrate 1 is covered with the insulator 26. Then, in process P14, the mask is removed and the conductive tape 27 is provided so as to connect the terminal of the grounding wire on the extended portion 30 and the surface of the polarizing plate 12a having a conductive film thereon with the aid of the conductive adhesive layer 27c of the conductive tape 27. Processes P11 and P13 are the same as those described in the embodiment. Also by this manufacturing method, occurrence of short circuits between the driver circuit on the extended portion 30 of the substrate 1 and the conductive tape 27 can be prevented.

Figure 9:
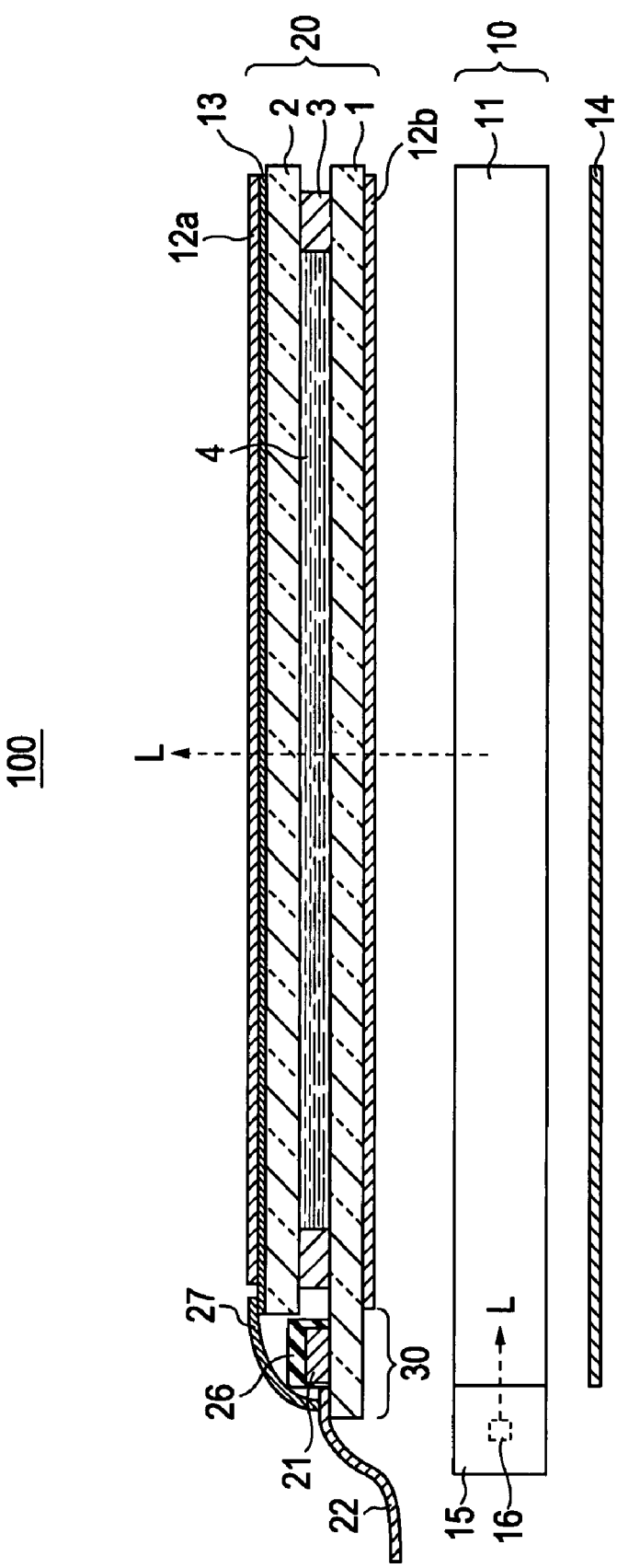
FIG. 9 is a cross-sectional view of the liquid crystal apparatus according to a second modification.

FIG. 9 is a cross-sectional view of the liquid crystal apparatus 100 according to a second modification. The liquid crystal apparatus 100 of the second modification differs from the liquid crystal apparatus 100 of the embodiment in that a transparent conductive film 13 composed of ITO or the like is provided between the substrate 2 and the polarizing plate 12a and that the transparent conductive film 13 and the terminal of the grounding wire GND of the FPC 22 have an electrical connection through the conductive tape 27. Also by this method, the liquid crystal apparatus 100 can function as a shield against external static electricity or the like, and generation of an electric field between the substrates 1 and 2 can be prevented. Thus, the transparent conductive film 13 functions as the conductive layer according to the embodiment of the invention.

Although the polarizing plate 12a has a conductive film thereon in the embodiment, the invention is not limited thereto. For example, a wire-grid polarizer in which a plurality of metal strips are provided in parallel at predetermined intervals on a polarizing plate may also be employed instead of the polarizing plate 12a. If such a wire-grid polarizer is employed, all of the parallel metal strips need to be electrically connected to the terminal of the grounding wire GND through the conductive tape 27. Such an electrical connection can be established by, for example, providing a separate metal strip such that each of the parallel metal strips has one end thereof underlying the separate metal strip thereby providing an electrical connection between the separate metal strip and the grounding wire GND through the conductive tape 27. Instead of employing the conductive polarizing plate, a conductive optical sheet, such as a conductive diffusing sheet, may also be employed as the conductive layer according to the embodiment of the invention.

Although the conductive tape 27 is electrically connected to the terminal of the grounding wire GND of the FPC 22 in the embodiment, the invention is not limited thereto. Instead, the conductive tape 27 may also be electrically connected to the COM terminal of the driver IC 21.

Although a single predetermined portion of the conductive layer has an electrical connection with the grounding wire GND of the FPC 22 through a single piece of the conductive tape 27 in the embodiment, a plurality of portions of the conductive layer may also have an electrical connection with the grounding wire GND of the FPC 22 through plural pieces of the conductive tape 27. In this manner, electricity charged on the surface of the conductive layer can more easily pass through the liquid crystal apparatus 100 to the outside.

In addition to the polarizing plate 12a, the polarizing plate 12b may also have conductivity and be connected to the grounding wire GND of the FPC 22 so as to establish an electrical connection therebetween through a conductive tape.

Although the liquid crystal display panel 20 is of the FFS type in the embodiment, the invention is not limited thereto. The liquid crystal display panel 20 may also be of the in-plane-switching (IPS) type. Further, the liquid crystal display panel 20 is not limited to being of the horizontal-electric-field type, but may also be of another type, such as the vertical-alignment (VA) type or the like.

Electronic Apparatus

Next, specific examples in which the liquid crystal apparatus 100 according to the embodiment of the invention is applied to an electronic apparatus will be described with reference to FIGS. 10A and 10B.

First, an example in which the liquid crystal apparatus 100 according to the embodiment of the invention is applied to a display unit of a portable personal computer, i.e., a laptop computer, will be described. Referring to FIG. 10A, which is a perspective view of the personal computer, a personal computer 710 includes a main body 712 having a keyboard 711, and a display unit 713 to which the liquid crystal apparatus 100 according to the embodiment of the invention is applied.

Next, an example in which the liquid crystal apparatus 100 according to the embodiment of the invention is applied to a display unit of a mobile phone will be described. Referring to FIG. 10B, which is a perspective view of the mobile phone, a mobile phone 720 includes a plurality of operation buttons 721, an earpiece 722, a mouthpiece 723, and a display unit 724 to which the liquid crystal apparatus 100 according to the embodiment of the invention is applied.

Figure 10A:
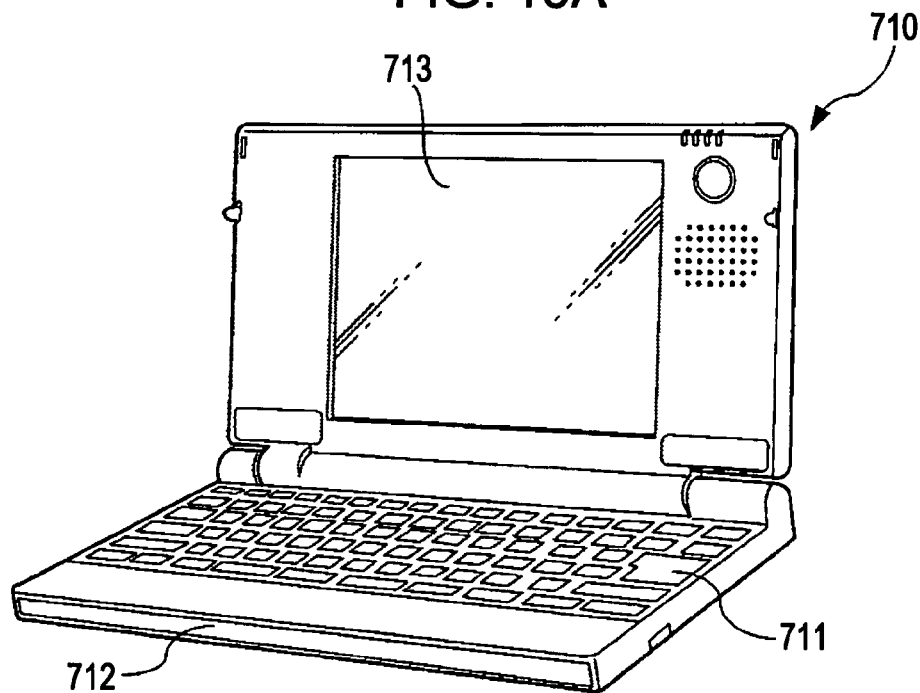
FIG. 10A illustrates an electronic apparatus to which the liquid crystal apparatus according to the embodiment of the invention is applied.
Figure 10B:
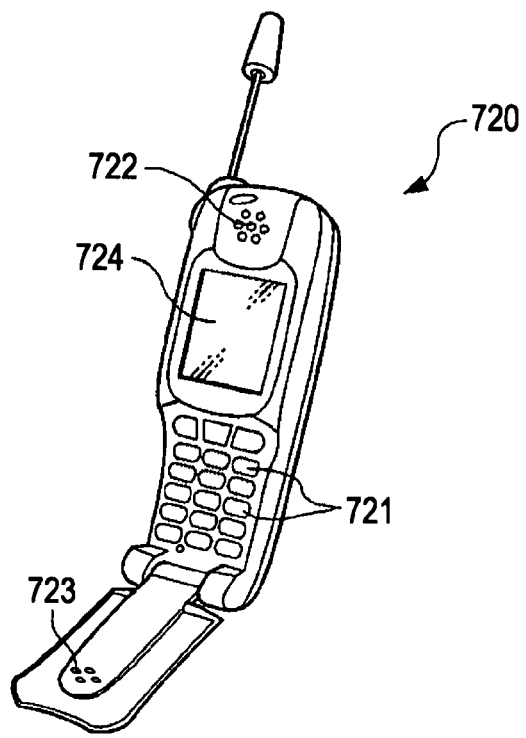
FIG. 10B illustrates another electronic apparatus to which the liquid crystal apparatus according to the embodiment of the invention is applied.

Electronic apparatuses to which the liquid crystal apparatus 100 according to the embodiment of the invention can be applied include not only personal computers and mobile phones such as those shown in FIG. 10A and FIG. 10B, respectively, but also liquid crystal televisions, view-finder-type or monitor-direct-view-type videotape recorders, car navigation systems, pagers, personal digital assistants, calculators, word processors, workstations, videophones, point-of-sale (POS) terminals, digital still cameras, and the like.

What is claimed is:

1. A liquid crystal apparatus comprising:
a liquid crystal display panel including two substrates with liquid crystal interposed therebetween;
a conductive layer provided on an outer surface of at least one of the substrates;
a flexible board electrically connected to the liquid crystal display panel; and
a tape-like conductive member providing an electrical connection between the conductive layer and a grounding wire of the flexible board,
wherein one of the two substrates has an extended portion extending beyond the other substrate, the extended portion having a surface provided thereon with a driver circuit and the flexible board,
wherein the tape-like conductive member is disposed across a region having the driver circuit, and
wherein at least a region where the driver circuit and the tape-like conductive member overlap each other is covered with an insulator.

2. The liquid crystal apparatus according to claim 1, wherein the extended portion is provided with a grounding wire electrically connected to the grounding wire of the flexible board, and
wherein the tape-like conductive member provides an electrical connection between the conductive layer and the grounding wire of the extended portion.

3. The liquid crystal apparatus according to claim 1, wherein the conductive layer includes a conductive optical sheet.

4. The liquid crystal apparatus according to claim 1, wherein the conductive layer includes a transparent conductive film provided on the outer surface of the at least one of the substrates.

5. The liquid crystal apparatus according to claim 1, wherein the liquid crystal display panel includes a common electrode and pixel electrodes provided on one of the two substrates, and
wherein the conductive layer is provided on an outer surface of the other substrate not having the common electrode and the pixel electrodes.

6. An electronic apparatus comprising the liquid crystal apparatus according to claim 1 as a display unit.

* * * * *